United States Patent
Rao et al.

(10) Patent No.: US 8,803,217 B2
(45) Date of Patent: Aug. 12, 2014

(54) PROCESS OF FORMING AN ELECTRONIC DEVICE INCLUDING A CONTROL GATE ELECTRODE, A SEMICONDUCTOR LAYER, AND A SELECT GATE ELECTRODE

(75) Inventors: Rajesh A. Rao, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1114 days.

(21) Appl. No.: 11/685,297

(22) Filed: Mar. 13, 2007

(65) Prior Publication Data

US 2008/0227254 A1    Sep. 18, 2008

(51) Int. Cl.
*H01L 29/788* (2006.01)

(52) U.S. Cl.
USPC .......................................... 257/316; 257/315

(58) Field of Classification Search
CPC ................... H01L 27/11568; H01L 27/11578
USPC .......... 438/257, 264, 266, 267; 257/315, 316, 257/E21.209
See application file for complete search history.

(56) References Cited

U.S. PATENT DOCUMENTS

| | | | | |
|---|---|---|---|---|
| 5,780,341 | A * | 7/1998 | Ogura | 438/259 |
| 5,824,584 | A * | 10/1998 | Chen et al. | 438/267 |
| 6,317,360 | B1 | 11/2001 | Kanamori | |
| 6,570,213 | B1 * | 5/2003 | Wu | 257/315 |
| 6,939,767 | B2 | 9/2005 | Hoefler et al. | |
| 7,060,594 | B2 | 6/2006 | Wang | |
| 7,112,490 | B1 | 9/2006 | Hong et al. | |
| 7,301,197 | B2 * | 11/2007 | Lojek | 257/322 |
| 2003/0218203 | A1 | 11/2003 | Hsieh | |
| 2004/0084710 | A1 * | 5/2004 | Baker et al. | 257/311 |
| 2006/0079053 | A1 * | 4/2006 | Chen et al. | 438/261 |
| 2006/0170034 | A1 | 8/2006 | Park et al. | |
| 2008/0182375 | A1 * | 7/2008 | Rao et al. | 438/267 |

FOREIGN PATENT DOCUMENTS

| | | |
|---|---|---|
| CN | 1762048 A | 4/2006 |
| EP | 1416540 A1 | 5/2004 |
| JP | 60246677 A | 12/1985 |
| JP | 200077632 | 3/2000 |
| JP | 2003218212 | 7/2003 |
| WO | 03012878 | 2/2003 |

OTHER PUBLICATIONS

E. Prinz "The Zen of Nonvolatile Memories" 2006 DAC.*

(Continued)

*Primary Examiner* — Leonard Chang

(57) ABSTRACT

An electronic device including a nonvolatile memory cell can include a substrate including a first portion and a second portion, wherein a first major surface within the first portion lies at an elevation lower than a second major surface within the second portion. The electronic device can also include a charge storage stack overlying the first portion, wherein the charge storage stack includes discontinuous storage elements. The electronic device can further include a control gate electrode overlying the first portion, and a select gate electrode overlying the second portion, wherein the select gate electrode includes a sidewall spacer. In a particular embodiment, a process can be used to form the charge storage stack and control gate electrode. A semiconductor layer can be formed after the charge storage stack and control gate electrode are formed to achieve the substrate with different major surfaces at different elevations. The select gate electrode can be formed over the semiconductor layer.

20 Claims, 6 Drawing Sheets

(56) References Cited

OTHER PUBLICATIONS

J. Yater "90nm Split-Gate Nanocrystal Non-Volatile Memory with Reduced Threshold Voltage" 2006, IEEE.*

PCT Search report and Written Opinion for corresponding PCT Application No. PCT/US08/53569 mailed Jun. 24, 2008.
EPC Application No. 08729518.4; Extended Search Report dated Aug. 31, 2010.

* cited by examiner

PROCESS OF FORMING AN ELECTRONIC DEVICE INCLUDING A CONTROL GATE ELECTRODE, A SEMICONDUCTOR LAYER, AND A SELECT GATE ELECTRODE

BACKGROUND

1. Field of the Disclosure

The present disclosure relates to processes of forming electronic devices, and more particularly to processes of forming electronic devices including control gate electrodes, semiconductor layers, and select gate electrodes.

2. Description of the Related Art

Split gate nonvolatile memory cells can be formed such that the surface of the substrate is higher at a region underlying the select gate electrode as compared to another region underlying the control gate electrode. The difference in elevation helps to provide ballistic injection of charge carriers into the charge storage media used for the nonvolatile memory cells, for example, silicon nanocrystals.

During formation of such a memory cell, a select gate dielectric layer and a select gate electrode are formed before forming a charge storage stack and a control gate electrode. The charge storage stack can include a gate dielectric layer, silicon nanocrystals, and a capping dielectric layer. The step formed in the substrate is caused by removing the select gate dielectric layer from an exposed region not covered by the select gate electrode and then by thermally oxidizing the substrate to form the control gate dielectric layer. After forming the remainder of the charge storage stack and the control gate electrode, a set of the silicon nanocrystals lies between the control gate electrode and the substrate ("the substrate set"), and another portion of the silicon nanocrystals lies between the control gate electrode and the select gate electrode ("the select gate set").

The select gate set of the silicon nanocrystals is problematic. Those silicon nanocrystals can accumulate charge but are difficult to erase. The silicon nanocrystals within the select gate set that lie adjacent to the substrate affect the threshold voltage of the memory cells, and therefore, they still need to be erased even though their erasure is difficult.

BRIEF DESCRIPTION OF THE DRAWINGS

Embodiments are illustrated by way of example and are not limited in the accompanying figures.

Figure 1:
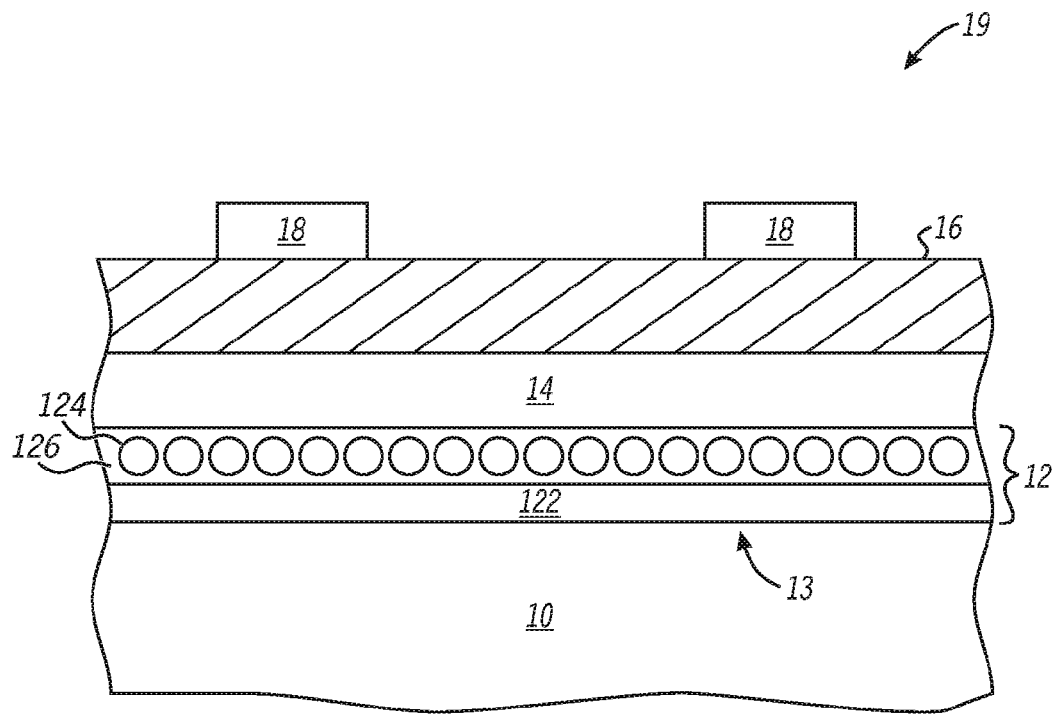
FIG. 1 includes an illustration of a cross-sectional view of a portion of a substrate after forming a plurality of layers and masking members.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a substrate with an elevational change between the select gate electrode and the control gate electrode of a nonvolatile memory cell to take advantage of ballistic injection of charge carriers when programming the memory cell. The charge storage stack does not lie between the select gate electrode and the control gate electrode. Thus, one or more of the erasing problems of prior art nonvolatile memory cells, as previously described, can be improved upon.

In one aspect, a process of forming an electronic device including a nonvolatile memory cell can include forming a charge storage stack over a substrate and forming a control gate electrode over the charge storage stack. The process can also include forming a semiconductor layer over the substrate after forming the control gate electrode, wherein the semiconductor layer is spaced apart from the control gate electrode. The process can further include forming a select gate electrode over the semiconductor layer.

Before addressing details of embodiments described below, some terms are defined or clarified. The term "elevation" is intended to mean a shortest distance to a reference plane. In one embodiment, the reference plane is a primary surface of a substrate before forming any features overlying the substrate.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes a cross-sectional view of a portion of an electronic device 10, such as an integrated circuit. The integrated circuit can be a standalone memory, a microcontroller, or other integrated circuit that includes a memory. In one embodiment, the electronic device 10 can include a nonvolatile memory ("NVM") array 19, a portion of which is illustrated in FIG. 1. A substrate 10 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of the substrate 10 between active regions inside the memory array 19 and in the peripheral areas outside of the NVM array 19. The upper most surface of substrate 10 is a primary surface 13. Optionally, the doping concentration of the substrate 10 along the primary surface 13 within the NVM array 19 can be increased using a conventional or proprietary doping operation to potentially reduce leakage current between subsequently-formed gate electrodes that may overlie portions of the primary surface 13.

A charge storage stack 12, including a gate dielectric layer 122, discontinuous storage elements 124, and another dielectric layer 126, can then be formed over the primary surface 13 of the substrate 10, as illustrated in FIG. 1. The gate dielectric layer 122 can be thermally grown using an oxidizing or nitridizing ambient, or deposited using a conventional or proprietary chemical vapor deposition technique, physical vapor deposition technique, atomic layer deposition technique, or a combination thereof. The gate dielectric layer 122 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. The gate dielectric layer 122 has a thickness in a range of approximately 3 to approximately 10 nm. The thickness and material selection of the dielectric layer 122 will substantially determine its electrical properties. In one embodiment, the thickness and material are chosen such that the dielectric layer 122 has a silicon dioxide equivalent thickness of approximately 10 nm.

The discontinuous storage elements 124 are then formed over NVM array 19. The individual discontinuous storage elements 124 are substantially physically separated from each other. The discontinuous storage elements 124 can include a material capable of storing a charge, such as silicon, a nitride, a metal-containing material, another suitable material capable of storing charge, or any combination thereof. For example, the discontinuous storage elements 124 can include silicon nanocrystals or metal nanoclusters. In one particular embodiment, a substantially continuous layer of amorphous silicon can be formed over exposed surfaces of the substrate 10. The substantially continuous layer can be exposed to heat or other processing conditions that can cause the layer to "ball up" or otherwise form silicon nanocrystals. The discontinuous storage elements 124 may be undoped, doped during deposition, or doped after deposition. In one embodiment, the discontinuous storage elements 124 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of the discontinuous storage elements 124 is no greater than approximately 10 nm in any dimension. In another embodiment, the discontinuous storage elements 124 can be larger, however, the discontinuous storage elements 124 are not formed so large as to form a continuous structure (i.e., all of the discontinuous storage elements 124 are not fused together).

The dielectric layer 126 is then formed over the discontinuous storage elements 124. The dielectric layer 126 can include one or more dielectric films, and is typically thermally grown or deposited. The dielectric layer 126 can include any one or more materials or be formed using any of the embodiments as described with respect to the gate dielectric 122 layer. The dielectric layer 126 can have the same or different composition compared to the dielectric 122 layer and may be formed using the same or different formation technique compared to the dielectric layer 122.

A control gate electrode layer 14 is then formed overlying the charge storage stack 12. The control gate electrode layer 14 can include a semiconductor-containing film, a metal-containing film, or any combination thereof. In one embodiment, the control gate electrode layer 14 includes polysilicon or amorphous silicon. In another embodiment, the control gate electrode layer 14 may include one or more other materials. In a particular embodiment, the thickness of control gate electrode layer 14 is not greater than approximately 200 nm, and in another particular embodiment is no greater than 90 nm. In yet another embodiment, the thickness of control gate electrode layer 14 is at least approximately 20 nm, and in another particular embodiment is at least 50 nm. In a finished device, the control gate electrode layer 14 can have a dopant concentration of at least 1E19 atoms/cm$^3$ when control gate electrode layer 14 includes polysilicon or amorphous silicon. The control gate electrode layer 14 can be deposited by chemical vapor deposition, physical vapor deposition, or a combination thereof. In one particular embodiment, the control gate electrode layer 14 is doped when deposited, and in another particular embodiment, is doped after it is deposited.

An insulating layer 16 is formed over the control gate electrode layer 14. The insulating layer 16 helps to protect the control gate electrode layer 14 during subsequently processing. The insulating layer 16 can include an oxide, a nitride, or an oxynitride. The material for the insulating layer 16 is selected to include a material different from subsequently-formed insulating spacers. In a particular embodiment, the insulating layer 16 includes a nitride. The thickness of the insulating layer 16 can be any of the thickness as described with respect to the control gate electrode layer 14. The insulating layer 16 has substantially the same thickness or a different thickness as compared to the control gate electrode layer 14. In the embodiment as illustrated in FIG. 1, the insulating layer 16 is deposited using a conventional or proprietary chemical vapor deposition technique, physical vapor deposition technique, or a combination thereof.

A patterned masking layer is then formed over the insulating layer 16, wherein the patterned masking layer includes masking members 18 at locations where gate structures are to be formed. The masking members 18 include an organic resist material or an inorganic material different from the underlying insulating layer 16 and the control gate electrode layer 14. The layer can be formed by a conventional or proprietary lithographic technique.

Figure 2:
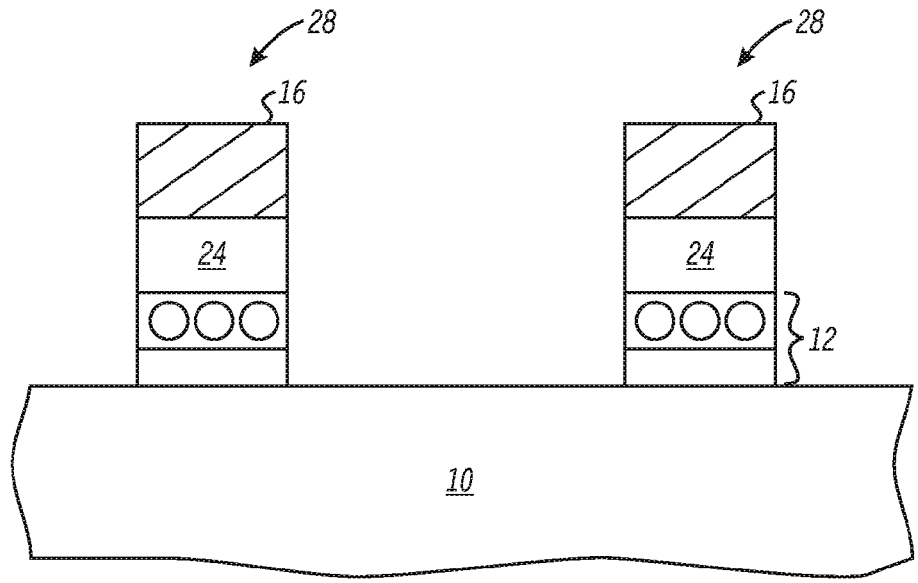
FIG. 2 includes an illustration of a cross-sectional view of the workpiece of FIG. 1 after forming gate structures.

FIG. 2 includes an illustration of the workpiece after forming gate structures 28, including control gate electrodes 24, and removing the masking members 18. More particularly, exposed portions of the insulating layer 16, the control gate electrode layer 14, and the charge storage stack 12 are removed to form the gate structures 28 that include the control gate electrodes 24. In one embodiment, the insulating layer 16, the control gate electrode layer 14, and the charge storage stack 12 are removed by conventional or proprietary etching techniques. The masking members 18 can be removed by a conventional or proprietary ashing technique. The timing for removing of the masking members 18 can be varied. In one embodiment, the masking members 18 are removed after exposing portions of the substrate 10. In another embodiment, the masking members 18 are removed after patterning the insulating layer 16 and the control gate electrode layer 14 and before removing all of the charge storage stack 12 outside of the gate structures 28. In still another embodiment, the masking members 18 are removed after patterning the insulating layer 16 and before removing all of the gate electrode layer 14 outside of the gate structures 28. After reading this specification, skilled artisans will be able to determine the particular patterning scheme that best meet their needs or desires.

Figure 3:
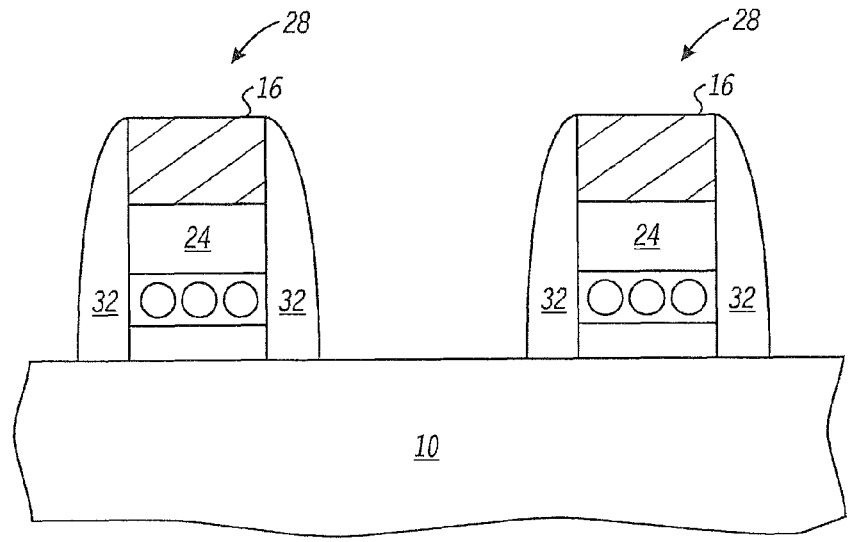
FIG. 3 includes an illustration of a cross-sectional view of the workpiece of FIG. 2 after forming sidewall spacers adjacent to the gate structures.

FIG. 3 includes an illustration of the workpiece after forming insulating spacers 32 adjacent to the gate structures 28. The insulating spacers 32 help to form a region within the channel having a relatively high electrical field to aid during programming of the nonvolatile memory cells. The insulating spacers 32 can include an oxide, a nitride, an oxynitride, or any combination thereof. In one embodiment, the insulating spacers 32 include a material different from the insulating layer 16. The width of each of the insulating spacers 32 at their bases is in a range of approximately 15 to approximately 25 nm. The insulating spacers 32 can be formed by substantially conformally depositing an insulating layer over the gate structures 28, including the control gate electrodes 24, and exposed portions of the substrate 10. The insulating layer can be anisotropically etched to form the sidewall spacers 32. In the embodiment as illustrated in FIG. 3, the insulating spacers 32 have an arc-shaped outer surface. In another embodiment (not illustrated), the insulating spacers 32 can have a triangular or squared-off shape. The deposition and etching of the insulating layer to form the insulating spacers 32 are performed using conventional or proprietary techniques and does not require using a mask.

Figure 4:
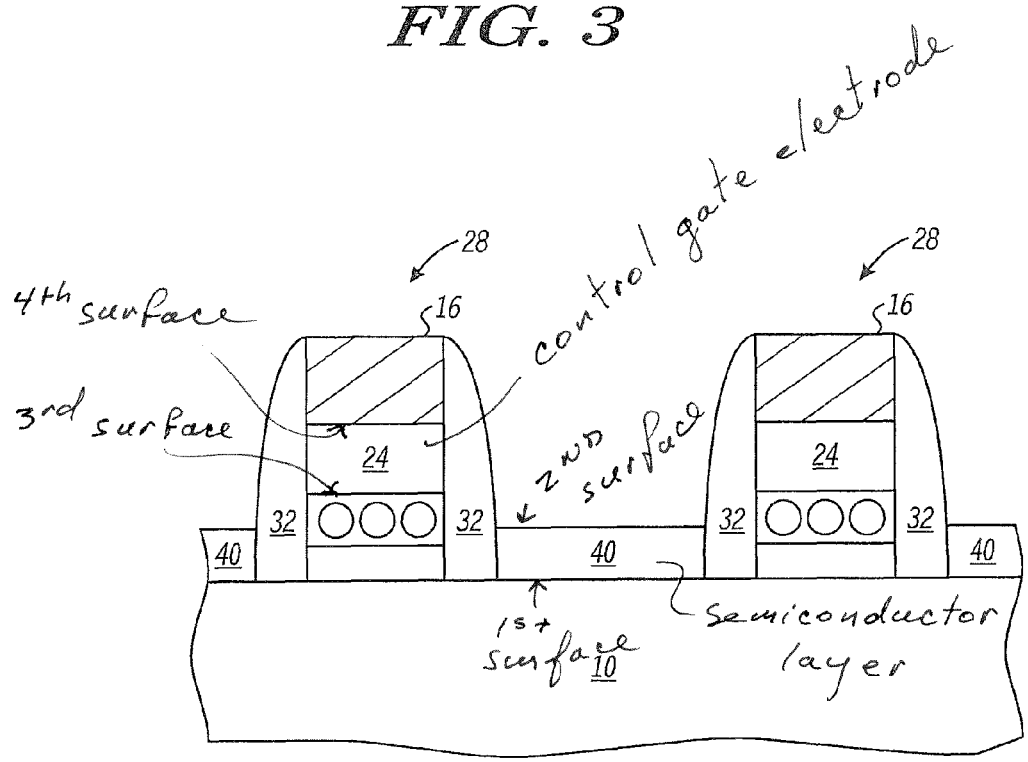
FIG. 4 includes an illustration of a cross-sectional view of the workpiece of FIG. 3 after forming a semiconductor layer over exposed portions of the substrate.

FIG. 4 includes an illustration of the workpiece after forming a semiconductor layer 40 over exposed portions of the substrate 10. The semiconductor layer 40 allows channel regions lying below subsequently-formed select gate electrodes to be formed at a relatively higher elevation to help ballistic injection of charge carriers into the discrete storage elements 124 during programming. The semiconductor layer 40 can include silicon, germanium, carbon, or a combination thereof. In a finished electronic device, the upper surface of the semiconductor layer 40 lies at an elevation at least as high as the upper surface of the gate dielectric layer 122 and no higher than the lower surface of the control gate electrode 24 adjacent to the semiconductor layer 40. In one embodiment, the semiconductor layer 40 has a thickness no greater than approximately 15 nm, and in another embodiment no greater than approximately 11 nm, and in still another embodiment no greater than approximately 9 nm. In a further embodiment, the semiconductor layer 40 has a thickness of at least approximately 2 nm, and in another further embodiment at least approximately 3 nm. In a particular embodiment, the semiconductor layer 40 has a thickness in a range of approximately 4 nm to approximately 6 nm. The semiconductor layer 40 can be formed using a conventional or proprietary selective deposition or growth technique. In a particular embodiment, the semiconductor layer 40 is formed using a selectively epitaxial growth technique. In this embodiment, substantially none of the semiconductor layer 40 is formed over the gate structures 28. In another embodiment, an amorphous semiconductor layer can be deposited and subsequently crystallized using the substrate 10 as a template to form a substantially monocrystalline semiconductor layer 40.

The semiconductor layer 40 can be doped or undoped as formed, can be subsequently doped by ion implantation, can be doped by diffusing dopant from the substrate 10 into the semiconductor layer 40, or any combination thereof. The semiconductor layer 40 can be subjected to further processing to change or improve its qualities. Such processing is optional and can include formation and removing of a sacrificial oxide, condensation if the semiconductor layer 40 includes a semiconductor element different from the substrate 10, other suitable processing, or any combination thereof.

Figure 5:
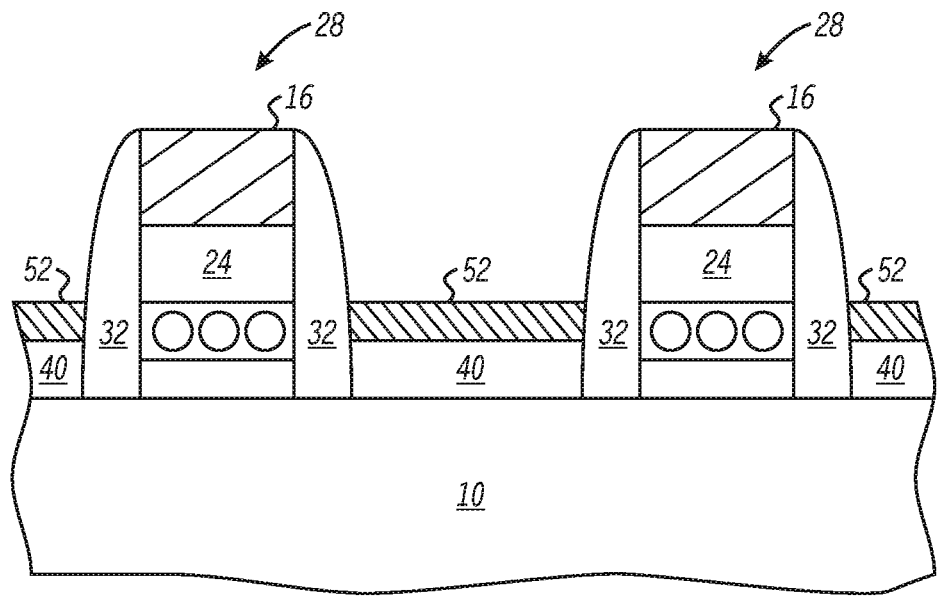
FIG. 5 includes an illustration of a cross-sectional view of the workpiece of FIG. 4 after forming a gate dielectric layer over the semiconductor layer.

FIG. 5 includes an illustration of the workpiece after forming a gate dielectric layer 52 over the semiconductor layer 40. The gate dielectric layer 52 can include any of the materials, thicknesses, and formation processes as described with respect to the gate dielectric layer 122. As compared to the gate dielectric layer 122, the gate dielectric layer 52 may have the same composition or different compositions, be formed by repeating the same process technique or different process techniques, or any combination thereof. In a particular embodiment, the gate dielectric layer 52 is a logic gate dielectric and is significantly thinner than the gate dielectric layer 122. In a particular embodiment, the gate dielectric layer 52 is less than half the thickness of the gate dielectric layer 122.

Figure 6:
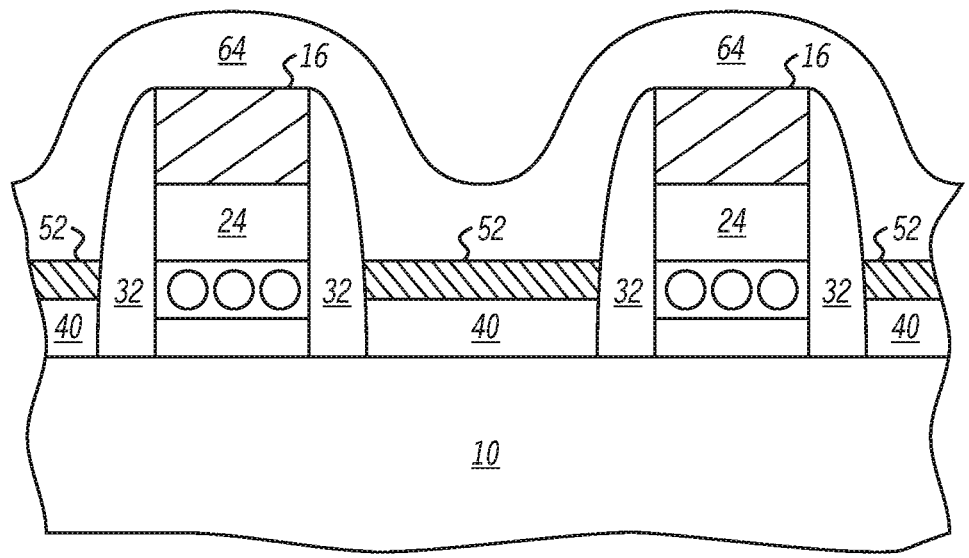
FIG. 6 includes an illustration of a cross-sectional view of the workpiece of FIG. 5 after forming a select gate electrode layer.

FIG. 6 includes an illustration after forming a select gate electrode layer 64 that overlies the gate dielectric layer 52, insulating spacers 32, and the gate structures 28. The select gate electrode layer 64 can include any of the materials, thicknesses, and formation processes as described with respect to the control gate electrodes 24. As compared to the control gate electrodes 24, the select gate electrode layer 64 may have the same composition or different compositions, the same thickness, or different thicknesses, be formed by repeating the same process technique or different process techniques, or any combination thereof. In a particular embodiment, the select gate electrode layer 64 is deposited substantially conformally over the exposed surfaces of the workpiece.

Figure 7:
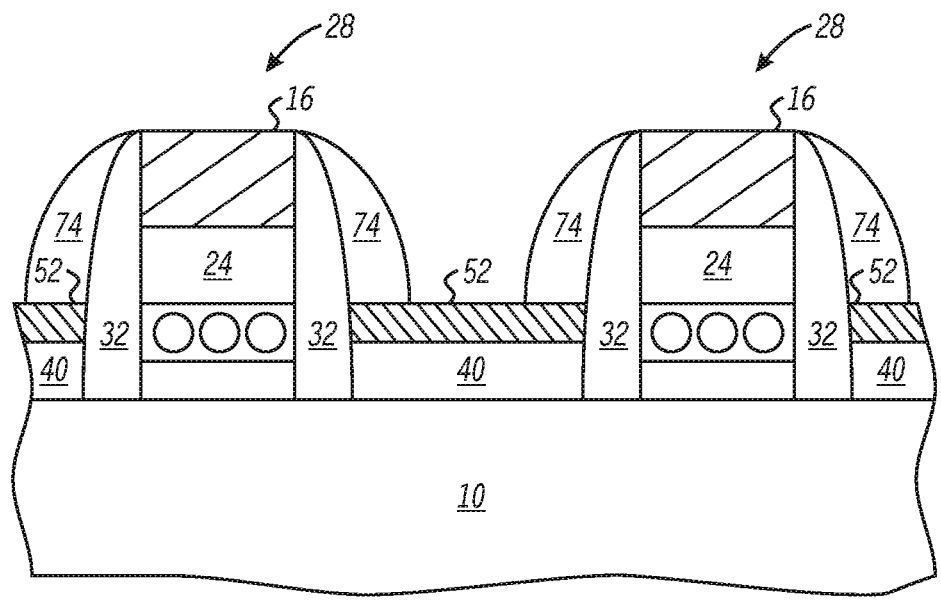
FIG. 7 includes an illustration of a cross-sectional view of the workpiece of FIG. 6 after forming sidewall spacers.

FIG. 7 includes an illustration of the workpiece after forming spacers 74. The select gate electrode layer 64 can be anisotropically etched to form the spacers 74. In the embodiment as illustrated in FIG. 7, the spacers 74 have an arc-shaped outer surface. In another embodiment (not illustrated), the spacers 74 can have a triangular or squared-off shape. The etching of the select gate electrode layer to form the spacers 74 is performed using a conventional or proprietary technique and does not require using a mask.

Figure 8:
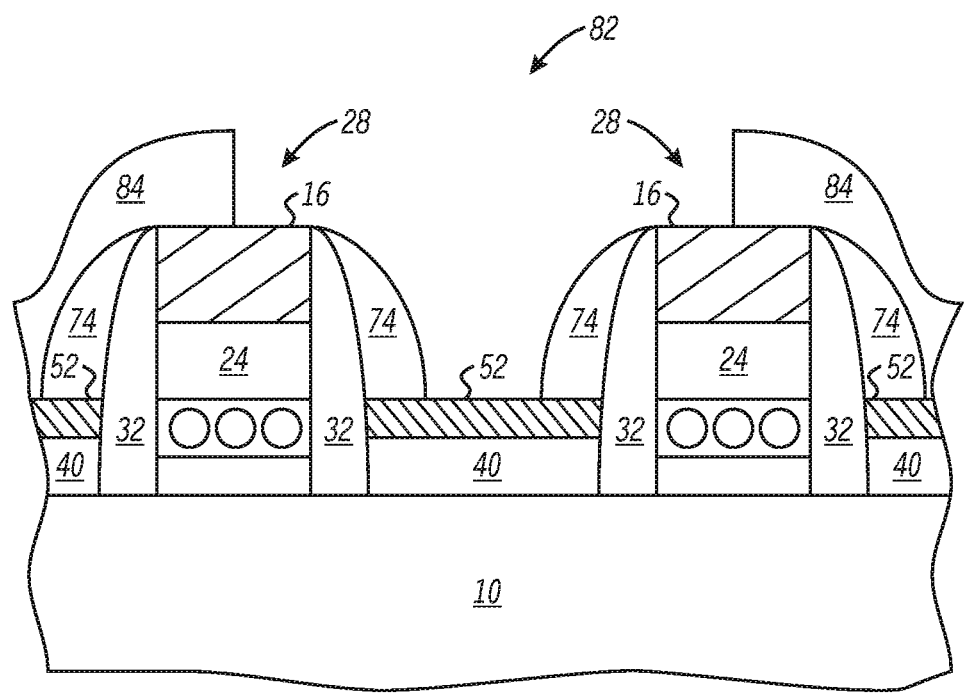
FIG. 8 includes an illustration of a cross-sectional view of the workpiece of FIG. 7 after forming a patterned masking layer.

FIG. 8 includes an illustration of the workpiece after forming a patterned masking layer including a masking member 84 and an opening 82. The patterned masking layer is used in conjunction with a subsequent etch to remove portions of the spacers 74 that are not to be part of the nonvolatile memory cells. As formed, the spacers 74 surround the gate structures

28. In one embodiment, each select gate electrode is to lie adjacent to its corresponding control gate electrode 24. The masking member 84 protects portions of the spacers 74 that are to remain, wherein an opening 82 exposes other portions of the spacers 74 that are to be removed. The patterned masking layer can be formed using an embodiment as described with respect to the masking members 18.

Figure 9:
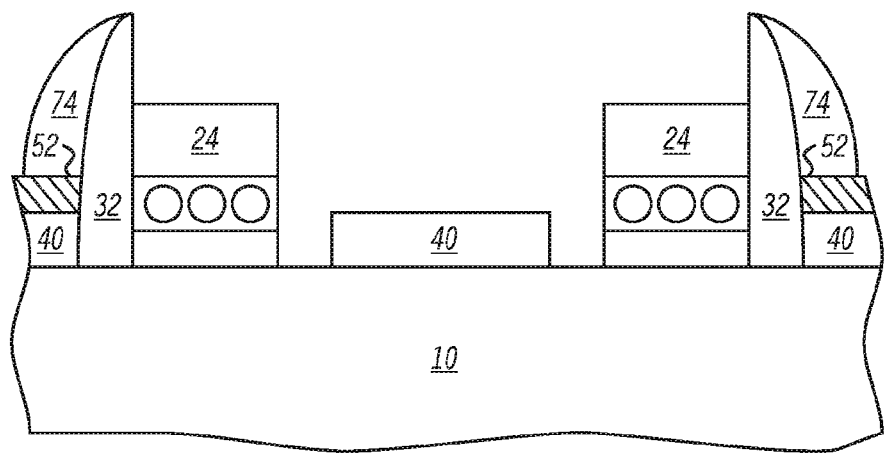
FIG. 9 includes an illustration of a cross-sectional view of the workpiece of FIG. 10 after removing portions of the sidewall spacers to form select gate electrodes.

FIG. 9 includes an illustration of the workpiece of FIG. 8 after forming the select gate electrodes 94 from the spacers 74. Referring briefly to FIG. 8, the portions of the spacers 74 within the opening 82 are removed using a conventional or proprietary etching technique. In one embodiment, additional etching is used to remove exposed portions of the gate dielectric layer 52, the semiconductor layer 40, and the insulating spacers 32 (between the gate structures 28). Alternatively, the exposed portions of insulating spacers 32, the semiconductor layer 40, the gate dielectric layer 52, or any combination thereof remain between the gate structures 28. In the particular embodiment as illustrated in FIG. 9, a portion of the semiconductor layer 40 remains between the gate structures. The masking member 84 can be removed by a conventional or proprietary ashing technique. Thus, the select gate electrodes 94 include remaining portions of the spacers 74. At this point, the insulating layer 16 is removed by a wet etch selective to other exposed materials.

Figure 10:
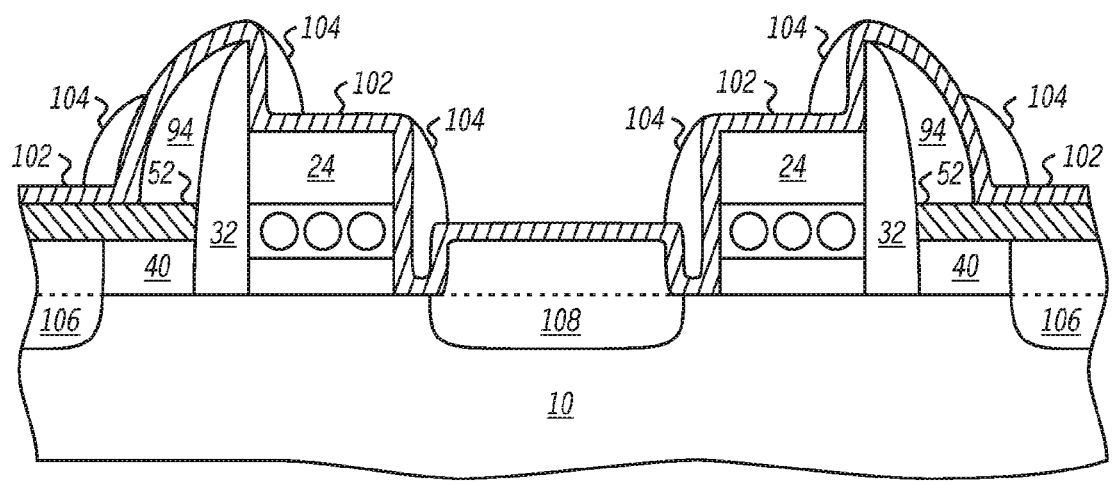
FIG. 10 includes an illustration of a cross-sectional view of the workpiece of FIG. 9 after forming insulating layers and doped regions within portions of the semiconductor layer and substrate.

FIG. 10 includes an illustration of the workpiece after forming insulating layer 102, spacers 104, and doped regions 106 and 108. The processing sequence used to form the workpiece as illustrated in FIG. 10 is described in more detail. Source/drain extensions (parts of doped regions 106 and 108) are implanted. During the implant, the select gate electrodes 94 and the control gate electrodes 24 are also doped. The dopant implanted may be a p-type dopant (e.g., boron) or an n-type dopant (e.g., phosphorus or arsenic). The implant is performed using a conventional or proprietary technique.

The insulating layer 102 is then formed and can include an oxide, a nitride, an oxynitride, or any combination thereof. The thickness of the insulating layers 102 acts as an implant screen during a subsequent ion implantation when forming source/drain ("S/D") regions. In one embodiment, the insulating layer 102 is formed by depositing an oxide layer to a thickness of approximately 5 to approximately 15 nm. The insulating layer 102 covers substantially all exposed surfaces of the workpiece. Then, a nitride layer is deposited to a thickness of approximately 50 to approximately 90 nm and anisotropically etched to form the spacers 104 around the memory cells, as well as on the tops of the control gate electrodes 24 adjacent to select gate electrodes 94. The spacers 104 that overlie the tops of the control gate electrodes 24 help to substantially prevent electrical shorts from forming between the select gate electrodes 94 and control gate electrodes 24 during a subsequent silicide formation.

A dopant is implanted into portions of the semiconductor layer 40 and the substrate 10 that are not covered by the gate structures 28 or the select gate electrodes 94 or the spacers 104 to complete formation of the doped regions 106 and 108, which are combinations of dopants from this implant and the source/drain extension implant. The doped regions 106 and 108 include portions of the semiconductor layer 40 and the substrate 10, wherein boundaries between the substrate 10 and the semiconductor layer 40 are illustrated in FIG. 10 with a dashed line. In one embodiment, the doped regions 106 and 108 can act as S/D regions. During the doping process, portions of the select gate electrodes 94 and the control gate electrodes 24 that are not covered by the spacers 104 are also doped. The dopant is a p-type dopant (e.g., boron) or an n-type dopant (e.g., phosphorus or arsenic). In one embodiment, the implanted dopant is activated by one or more subsequent thermal cycles, which may or may not serve a different primary purpose such as oxidation, deposition, annealing, drive or activation of a different implant dopant. In one embodiment, each of the doped regions 106 and 108 has a dopant concentration of at least approximately 1E19 atoms/cm$^3$. The implantations to form the doped regions 106 and 108 are performed using conventional of proprietary techniques.

In one embodiment, the portions of the workpiece can be silicided but are not illustrated in the figures. Referring to FIG. 10, portions of the gate dielectric layer 52 and the insulating layer 102 that are not covered by the spacers 104 are removed. A metal-containing layer is deposited and reacted with exposed portions of the control gate electrodes 24, select gate electrodes 94, and the doped regions 106 and 108 to form metal-containing silicide regions. The metal-containing silicide regions are formed using a conventional or proprietary material and a conventional or proprietary processing technique.

In one embodiment, the NVM array 19 is now substantially complete other than formation of the electrical connections. Component fabrication within peripheral areas (not illustrated) of the electronic device can be performed using one or more conventional or proprietary techniques. Referring to FIG. 10, two memory cells are illustrated that share the doped region 108. Each memory cell includes a control gate electrode 24, a select gate electrode 94, and a set of discontinuous storage elements.

Figure 11:
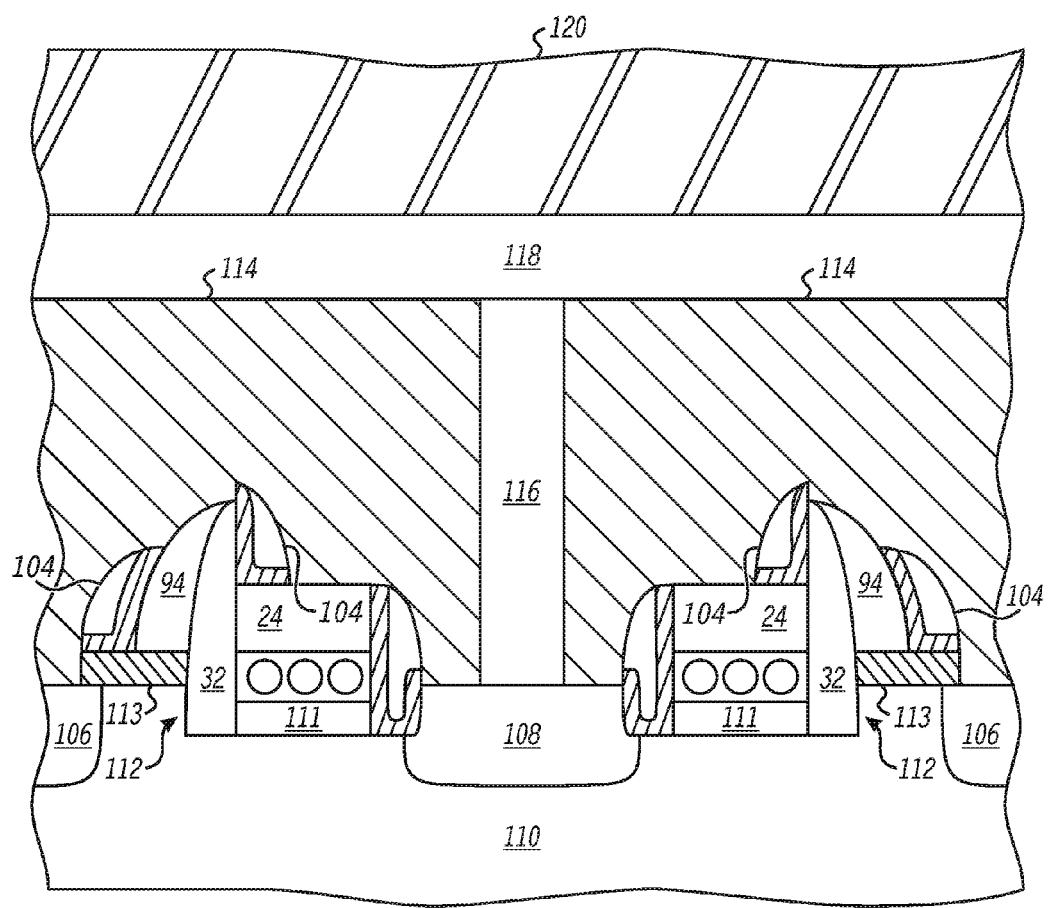
FIG. 11 includes an illustration of a cross-sectional view of the workpiece of FIG. 10 after forming a substantially completed integrated circuit.

FIG. 11 includes an illustration of a cross-sectional view of a substantially completed electronic device. As illustrated in FIG. 11, a composite substrate 110 represents a combination of the substrate 10 and the semiconductor layer 40. The composite substrate 110 includes a first major surface 111, which corresponds to the primary surface 13 of the substrate 10, and a second major surface 113, which corresponds to the upper surface of the semiconductor layer 40 in the finished electronic device. A wall 112 lies between first major surface 111 and the second major surface 113. The combination of the different major surfaces and the wall 112 therebetween help to form a region from which ballistic injection of charge carriers into the charge storage stack 12 can occur.

Referring to other parts of the electronic device and their formation, an interlevel dielectric layer 114 is formed over the workpiece by a conventional or proprietary technique. The interlevel dielectric layer 114 is patterned to form a contact opening that extends to the doped region 108. Although not illustrated in FIG. 11, other contact openings are made to the doped regions 106, the control gate electrodes 24, the select gate electrodes 94, and to other portions within and outside of the NVM array 19. The interlevel dielectric layer 114 can include an insulating material, such as an oxide, a nitride, an oxynitride, or a combination thereof. In a specific embodiment, an anisotropic etch can be used to form contact openings.

A conductive plug 116 and a conductive line 118 are then formed. Other conductive plugs and conductive lines are formed but are not illustrated in FIG. 11. The conductive plug 116 and the conductive line 118 can include the same or different conducting materials. Each of the conductive plug 116 and the conductive line 118 can include doped silicon, tungsten, titanium, tantalum, titanium nitride, tantalum nitride, aluminum, copper, another suitable conductive material, or any combination thereof. In one particular embodiment, the conductive plug 116 includes tungsten, and the conductive line 118 includes copper. An optional barrier layer, adhesion layer, or any combination thereof may be formed before the corresponding conductive layers (e.g., tungsten for the conductive plug 116 and copper for the conductive line 118). An optional capping layer (e.g., a metal-containing nitride) may be used to encapsulate copper within the conductive line 118.

In one embodiment, the conductive plug 116 is formed before the conductive line 118. In one particular embodiment, a conductive layer (not illustrated) is formed over interlevel dielectric layer 114 and substantially fills contact openings therein. Portions of the conductive layer that lie outside the contact openings are removed to form the conductive plugs 116. A conventional or proprietary chemical-mechanical polishing operation or a conventional or proprietary etching process can be performed.

Another insulating layer (not illustrated) is then deposited and patterned to form interconnect trenches where the conductive line 118 are formed. Other interconnect trenches can be formed at locations within the NVM array 19, outside the NVM array 19, or any combination thereof. In one embodiment, another conductive layer is formed over the interlevel dielectric layer 114 and substantially fills the interconnect trenches in the insulating layer. Portions of the conductive layer that lie outside the interconnect trenches within the insulating layer are removed to form the conductive line 118. In one embodiment, a conventional or proprietary chemical-mechanical polishing operation can be performed, and in another embodiment, a conventional or proprietary etching process can be performed. The insulating layer lies at substantially the same elevation as and between the conductive line 118 and other conductive lines that are not illustrated. In another embodiment (not illustrated), the conductive plug 116 and the conductive line 118 are formed concurrently using a conventional or proprietary dual-inlaid process.

In another embodiment (not illustrated), additional insulating and conductive layers can be formed and patterned to form one or more additional levels of interconnects. After the last interconnect level has been formed, an encapsulating layer 120 is formed over substrate 11, including the NVM array 19 and peripheral areas. The encapsulating layer 120 can include one or more insulating film, such as an oxide, a nitride, an oxynitride, or a combination thereof.

The memory cells within the NVM 19 can be programmed, read, and erased using conventional or proprietary biasing conditions. Each memory cell within the NVM array 19 can store up to two bits of data. One of the bits lies adjacent to the select gate electrode 94 and the wall 112. That particular bit can be programmed using source-side injection. The other bit lies adjacent to the doped region 108 and can be programmed using drain-side hot carrier injection or Fowler-Nordheim tunneling.

In another embodiment (not illustrated), a different charge storage stack can be used. The problem as described in the related art section is particularly problematic in nonvolatile memory where charge is trapped or otherwise localized, as opposed to a floating gate electrode, in which charge can more freely migrated within the floating gate electrode. In this other embodiment, the discontinuous storage elements 124 can be replaced by or used in conjunction with a nitride layer. In a particular embodiment, the charge storage stack includes an ONO (oxide-nitride-oxide) stack.

Embodiments as described herein can still obtain the benefits of ballistic injection. Substantially none of the discontinuous storage elements or nitride layer within the charge storage stack lies between the control gate electrode 24 and the select gate electrode 94 within the same memory cell. Thus, the erasing problems as described in the related art are substantially eliminated. The process of forming the electronic device does not require any additional masking layer, and therefore, can be integrated into an existing process flow without substantially increasing manufacturing costs.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device including a nonvolatile memory cell can include forming a charge storage stack over a substrate and forming a control gate electrode over the charge storage stack. The process can also include forming a semiconductor layer over the substrate after forming the control gate electrode, wherein the semiconductor layer is spaced apart from the control gate electrode. The process can further include forming a select gate electrode over the semiconductor layer.

In one embodiment of the first aspect, the process further includes forming an insulating spacer after forming the control gate electrode and before forming the semiconductor layer over the substrate. In a particular embodiment, forming the insulating spacer includes forming an insulating layer over the control gate electrode and the substrate and anisotropically etching the insulating layer to form the insulating spacer. In another particular embodiment, forming the select gate electrode includes forming a select gate electrode layer over the control gate electrode, the insulating spacer, and the semiconductor layer, anisotropically etching the select gate electrode layer to form a sidewall spacer, and removing a portion of the sidewall spacer to form the select gate electrode. In another embodiment, forming the semiconductor layer comprises selectively forming the semiconductor layer over the substrate. In a particular embodiment, forming the semiconductor layer comprises selectively epitaxially growing the semiconductor layer from the substrate.

In a further embodiment of the first aspect, forming the charge storage stack includes forming a first gate dielectric layer over the substrate and forming discontinuous storage elements over the first gate dielectric layer. In a particular embodiment, the process further includes forming a second gate dielectric layer over the semiconductor layer before forming the select gate electrode, wherein the second gate dielectric layer is thinner than the first gate dielectric layer. In another particular embodiment, forming the semiconductor layer includes forming the semiconductor layer including a first surface adjacent to the substrate and a second surface opposite the first surface, wherein the second surface lies at a first elevation. Also, forming the control gate electrode includes forming the control gate electrode including a third surface adjacent to the substrate and a fourth surface opposite the third surface, wherein the third surface lies at a second elevation that is at least as high as the first elevation. In a more particular embodiment, forming the first gate dielectric layer includes forming the first gate dielectric layer including a fifth surface adjacent to the substrate and a sixth surface opposite the fifth surface, wherein the sixth surface lies at a third elevation, wherein the first elevation lies between the second elevation and the third elevation.

In a second aspect, a process of forming an electronic device including a nonvolatile memory cell can include forming a first gate dielectric layer over a substrate, forming discontinuous storage elements over the first gate dielectric layer, and forming a control gate electrode over the discontinuous storage elements. The process can also include removing an exposed portion of the discontinuous storage elements after forming the control gate electrode. The process can further include forming an insulating spacer adjacent to the control gate electrode and selectively growing a semiconductor layer from an exposed portion of the substrate after forming the insulating spacer. The process can still further include forming a second gate dielectric layer over the semiconductor layer and forming a select gate electrode over the second gate dielectric layer. In one embodiment, the semiconductor layer has a first surface lying furthest from the substrate, wherein the first surface lies at a first elevation, the control gate electrode has a second surface lying closest to the substrate, wherein the second surface lies at a second elevation, the first gate dielectric layer has a third surface lying furthest from the substrate, wherein the third surface lies at a third elevation, and the first elevation lies between the second elevation and the third elevation.

In another embodiment of the second aspect, forming the control gate electrode includes forming a control gate electrode layer over the discontinuous storage elements, forming a nitrogen-containing layer over the control gate electrode layer, forming a mask over the nitrogen-containing layer, patterning the nitride-containing layer, and patterning the control gate electrode layer to form the control gate electrode. Forming the select gate electrode includes forming a select gate electrode layer over the control gate electrode, the insulating spacer, and the semiconductor layer, and anisotropically etching the select gate electrode layer to form the select gate electrode, wherein anisotropically etching is performed without using a mask.

In still another embodiment of the second aspect, the first gate dielectric layer is thicker than the second gate dielectric layer. In a particular embodiment, removing the exposed portion of the charge storage stack includes reacting the discontinuous storage elements within the exposed portion of the charge storage stack to form an insulating material, and etching the insulating material and the first gate dielectric layer within the exposed portion of the charge storage stack In a third aspect, an electronic device including a nonvolatile memory cell can include a substrate including a first portion and a second portion, wherein a first major surface within the first portion lies at an elevation lower than a second major surface within the second portion. The electronic device can also include a charge storage stack overlying the first portion wherein the charge storage stack includes discontinuous storage elements, a control gate electrode overlying the first portion, and a select gate electrode overlying the second portion, wherein the select gate electrode includes a sidewall spacer.

In one embodiment of the third aspect, the electronic device further includes an insulating spacer lying between the control gate electrode and the select gate electrode. In another embodiment, the electronic device further includes a first gate dielectric layer lying between the control gate electrode and the first portion of the substrate, and a second gate dielectric layer lying between the select gate electrode and the second portion of the substrate, wherein the second gate dielectric layer is thinner than the first gate dielectric layer.

In a further embodiment of the third aspect, the electronic device further includes a first source/drain region adjacent to the control gate electrode, and a second source/drain region adjacent to the select gate electrode. In still a further embodiment, substantially none of the discontinuous storage elements lies between the control gate electrode and the select gate electrode. In a particular embodiment, substantially none of the discontinuous storage elements overlies the second portion of the substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device including a nonvolatile memory cell comprising:
    forming a charge storage stack over a substrate;
    forming a control gate electrode over the charge storage stack;
    forming a semiconductor layer over the substrate after forming the control gate electrode, wherein the semiconductor layer is spaced apart from the control gate electrode;

forming a select gate electrode over the semiconductor layer, wherein the select gate electrode has a substantially triangular shape; and forming a first insulating spacer partially over the control gate electrode and adjacent to the select gate electrode, wherein the control gate is between the first insulating spacer and the charge storage stack.

2. The process of claim 1, further comprising forming a second insulating spacer after forming the control gate electrode and before forming the semiconductor layer over the substrate.

3. The process of claim 2, wherein forming the second insulating spacer comprises:

forming an insulating layer over the control gate electrode and the substrate; and anisotropically etching the insulating layer to form the second insulating spacer.

4. The process of claim 2, wherein forming the select gate electrode comprises:

forming a select gate electrode layer over the control gate electrode, the second insulating spacer, and the semiconductor layer;

anisotropically etching the select gate electrode layer to form a select gate electrode.

5. The process of claim 1, wherein forming the charge storage stack comprises:

forming a first gate dielectric layer over the substrate; and forming discontinuous storage elements over the first gate dielectric layer.

6. The process of claim 5, further comprising forming a second gate dielectric layer via a logic process over the semiconductor layer before forming the select gate electrode, wherein the second gate dielectric layer is thinner than the first gate dielectric layer.

7. The process of claim 5, wherein:

forming the semiconductor layer comprises forming the semiconductor layer including a first surface adjacent to the substrate and a second surface opposite the first surface, wherein the second surface lies at a first elevation; and forming the control gate electrode comprises forming the control gate electrode including a third surface adjacent to the substrate and a fourth surface opposite the third surface, wherein the third surface lies at a second elevation that is at least as high as the first elevation.

8. The process of claim 7, wherein forming the first gate dielectric layer comprises forming the first gate dielectric layer including a fifth surface adjacent to the substrate and a sixth surface opposite the fifth surface, wherein the sixth surface lies at a third elevation, wherein the first elevation lies between the second elevation and the third elevation.

9. The process of claim 1, wherein forming the control gate electrode, forming the semiconductor layer, and forming the select gate electrode are performed such that:

a first channel region is disposed under the control gate electrode;

a second channel region is disposed under the select gate electrode; and the second channel region lies at a higher elevation than the first channel region.

10. The process of claim 1, wherein forming the control gate electrode, forming the semiconductor layer, and forming the select gate electrode are performed such that:

a first channel region is disposed within the substrate under the control gate electrode, wherein the first channel region does not include the semiconductor layer; and a second channel region includes a portion of the semiconductor layer under the select gate electrode.

11. The process of claim 1, wherein forming the select gate electrode having a substantially triangular shape is performed such that:

the select gate electrode has an arc-shaped outer surface.

12. The process of claim 1, wherein forming the first insulating spacer comprises:

forming an insulating layer over the control gate electrode and the substrate; and isotropically etching the insulating layer to form the first insulating spacer.

13. A process of forming an electronic device including a nonvolatile memory cell comprising:

forming a first gate dielectric layer over a substrate;

forming discontinuous storage elements over the first gate dielectric layer;

forming a control gate electrode over the discontinuous storage elements;

removing an exposed portion of the discontinuous storage elements after forming the control gate electrode;

forming a first insulating spacer adjacent to the control gate electrode;

selectively growing a semiconductor layer from an exposed portion of the substrate after forming the insulating spacer;

forming a second gate dielectric layer over the semiconductor layer;

forming a select gate electrode over the second gate dielectric layer; and forming a second insulating spacer partially over the control gate electrode and adjacent to the select gate electrode, wherein the control gate is between the second insulating spacer and the discontinuous storage elements, wherein:

the semiconductor layer has a first surface lying farthest from the substrate, wherein the first surface lies at a first elevation;

the control gate electrode has a second surface lying closest to the substrate, wherein the second surface lies at a second elevation;

the first gate dielectric layer has a third surface lying farthest from the substrate, wherein the third surface lies at a third elevation;

the first elevation lies between the second elevation and the third elevation; and the select gate electrode has a substantially triangular shape.

14. The process of claim 13, wherein:

forming the control gate electrode comprises:

forming a control gate electrode layer over the discontinuous storage elements;

forming a nitrogen-containing layer over the control gate electrode layer;

forming a mask over the nitrogen-containing layer;

patterning the nitrogen-containing layer; and patterning the control gate electrode layer to form the control gate electrode; and forming the select gate electrode comprises:

forming a select gate electrode layer over the control gate electrode, the first insulating spacer, and the semiconductor layer; and anisotropically etching the select gate electrode layer to form the select gate electrode, wherein anisotropically etching is performed without using a mask.

15. The process of claim 13, wherein the first gate dielectric layer is thicker than the second gate dielectric layer formed via a logic process.

16. The process of claim 15, wherein selectively growing a semiconductor layer comprises epitaxially growing the semiconductor layer.

17. The process of claim 13, wherein forming the control gate electrode, selectively growing the semiconductor layer, and forming the select gate electrode are performed such that:
 a first channel region is disposed under the control gate electrode;
 a second channel region is disposed under the select gate electrode; and
 the second channel region lies at a higher elevation than the first channel region.

18. The process of claim 13, wherein forming the control gate electrode, selectively growing the semiconductor layer, and forming the select gate electrode are performed such that:
 a first channel region is disposed within the substrate under the control gate electrode, wherein the first channel region does not include the semiconductor layer; and
 a second channel region includes a portion of the semiconductor layer under the select gate electrode.

19. The process of claim 13, wherein forming the second insulating spacer comprises:
 forming an insulating layer over the control gate electrode and the substrate; and
 isotropically etching the insulating layer to form the second insulating spacer.

20. A process of forming an electronic device including a nonvolatile memory cell comprising:
 forming a charge storage stack over a substrate;
 forming a control gate electrode over the charge storage stack;
 forming a semiconductor layer over the substrate after forming the control gate electrode, wherein the semiconductor layer is spaced apart from the control gate electrode;
 forming a select gate electrode over the semiconductor layer, wherein forming the select gate electrode comprises:
  forming a select gate electrode layer over the control gate electrode, a first insulating spacer, and the semiconductor layer; and
  forming a second insulating spacer partially over the control gate electrode and adjacent to the spacer and the charge storage stack; and
 anisotropically etching the select gate electrode layer to form select gate electrode spacers, wherein at least one select gate electrode spacer serves as the select gate electrode for the nonvolatile memory cell.

\* \* \* \* \*